United States Patent
Ilgenstein et al.

(10) Patent No.: US 9,300,296 B2
(45) Date of Patent: Mar. 29, 2016

(54) LEVEL SHIFTER CIRCUIT

(71) Applicant: FREESCALE SEMICONDUCTOR, INC., Austin, TX (US)

(72) Inventors: Kerry A. Ilgenstein, Austin, TX (US); Gilles J. Muller, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 85 days.

(21) Appl. No.: 14/132,751

(22) Filed: Dec. 18, 2013

(65) Prior Publication Data

US 2015/0171866 A1 Jun. 18, 2015

(51) Int. Cl.
| | |
|---|---|
| H03L 5/00 | (2006.01) |
| H03K 19/0175 | (2006.01) |
| H03K 19/0185 | (2006.01) |
| G11C 8/08 | (2006.01) |
| G11C 16/12 | (2006.01) |
| H03K 3/356 | (2006.01) |

(52) U.S. Cl.
CPC ............. *H03K 19/0175* (2013.01); *G11C 8/08* (2013.01); *G11C 16/12* (2013.01); *H03K 3/35613* (2013.01); *H03K 3/356182* (2013.01); *H03K 19/0185* (2013.01)

(58) Field of Classification Search
USPC ............ 327/306, 318–320, 325, 333; 326/63, 326/80–81
See application file for complete search history.

(56) References Cited

U.S. PATENT DOCUMENTS

| | | | |
|---|---|---|---|
| 5,539,334 A | 7/1996 | Clapp et al. | |
| 5,963,054 A | 10/1999 | Cochran et al. | |
| 6,580,291 B1 * | 6/2003 | Lutley | 326/81 |
| 7,560,970 B2 | 7/2009 | Cook et al. | |
| 7,847,612 B2 * | 12/2010 | Ku | 327/333 |
| 7,952,415 B2 * | 5/2011 | Shim | 327/333 |
| 8,217,701 B2 * | 7/2012 | Kim | 327/333 |
| 2008/0054979 A1 | 3/2008 | Nagumo | |
| 2009/0039942 A1 | 2/2009 | Cook et al. | |

FOREIGN PATENT DOCUMENTS

WO 2010117513 A1 10/2010

* cited by examiner

*Primary Examiner* — An Luu

(57) ABSTRACT

A level shifting circuit that includes a level shifter and a circuit stage. The circuit stage includes a pair of diodes circuits. The circuit stage includes a first output node and a second output node. The first output node is coupled via a current path to a first output of the level shifter and the second output node is coupled to via a current path to a second output of the level shifter. One of the diodes is coupled to the first output node and a power supply terminal. The other diode is coupled to the second output node and the power supply terminal.

19 Claims, 1 Drawing Sheet

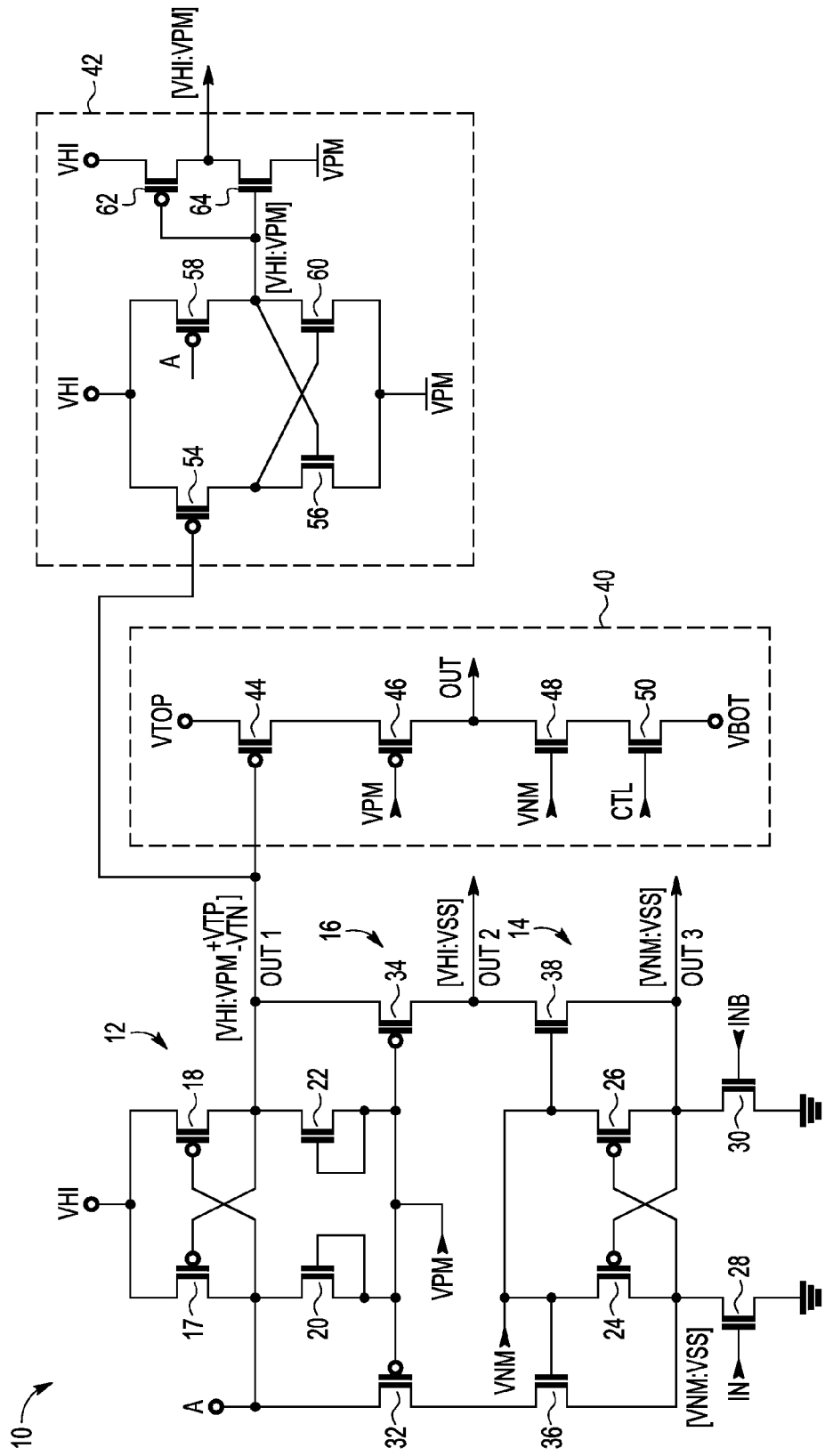

LEVEL SHIFTER CIRCUIT

BACKGROUND

1. Field

This disclosure relates generally to level shifters used in integrated circuits, especially ones requiring significantly higher voltages than are used by the normal logic transistors.

2. Related Art

Non-volatile memories (NVMs) typically require higher voltages than the power supply used for the logic transistors. The logic transistors can be made differently, typically by increasing the thickness of the gate dielectric and extending the gate length, to provide some extension of the voltage they can use for logic operations. This increase in voltage capability is typically not enough though so level shifters are required. Level shifters can have sensitivities to the process used to make the transistors that form the level shifters. If process variations are greater than anticipated or process changes result in somewhat different operating characteristics, there may be difficulties with an existing design.

Accordingly there is a need to provide further improvement in achieving level shifters that function well over a broad range of processes.

BRIEF DESCRIPTION OF THE DRAWINGS

The present invention is illustrated by way of example and is not limited by the accompanying FIGURES, in which like references indicate similar elements. Elements in the FIGURES are illustrated for simplicity and clarity and have not necessarily been drawn to scale.

The FIGURE is a circuit diagram of a level shifter circuit, which may also be called a level shifting circuit, that includes a level shifter and two prior art circuits that use the level shifter.

DETAILED DESCRIPTION

In one aspect, a level shifter has a first stage and a second stage. The second stage utilizes diodes to provide clamping as needed while avoiding drawing current in certain situations. The avoiding drawing current allows for a broader range of process variations and process changes for the level shifter. The level shifter has outputs useful for various level shifting functions.

Shown in the FIGURE is a level shifter 10 comprising a P latch 12, an N latch 14, and a transfer circuit 16. Also shown in the FIGURE are a circuit 40 and a circuit 42, which are prior art circuits, that are coupled to level shifter 10. Latch 12 comprises P channel transistors 17 and 18 and N channel transistors 20 and 22. Latch 14 comprises P channel transistors 24 and 26 and N channel transistors 28 and 30. Transfer circuit 16 comprises P channel transistors 32 and 34 and N channel transistors 36 and 38. Transistor 17 has a source connected to a node for receiving a high voltage Vhi, a drain, and a gate. This node for receiving high voltage Vhi may be referenced as Vhi. Transistor 18 has a source connected to Vhi, a gate connected to the drain of transistor 17, and a drain connected to the gate of transistor 17. Transistors 20 and 22 are diode-connected and function as diodes and may be referenced as diodes. In the case of N and P channel transistors, the sources and drains are typically made the same and often referred to as source/drains. A source/drain of a transistor may also be called a current terminal of the transistor. The particular designation as to source or drain is based on how they are connected. In this case, one source/drain is connected to the gate and forms the anode of the diode. The other source/drain is the cathode of the diode. Thus the anode of the diode formed from transistor 20 is configured to receive an intermediate voltage VPM. This node may be referred to as VPM and may be considered a power supply terminal. The cathode of the diode formed from transistor 20 is coupled to the drain of transistor 17. As for the diode formed using transistor 22, the anode is coupled to VPM and the cathode is coupled to the drain of transistor 18. Latches 12 and 14 are called latches because of the cross coupled feedback of the P channel transistors during a change of state but each of latches 12 and 14 functions as a level shifter so they may be called level shifters as well as latches. Latches 12 and 14 function somewhat differently so latch 12 may be referenced as a stage while latch 14 may be referenced as a level shifter. Transfer circuit 16 passes current through transistors 32 and 36 as one current path and passes current through transistors 34 and 38 as another current path. N channel transistors may also be called NFETs and P channel transistors may be called PFETs.

Transistor 28 has a source connected to ground, a gate for receiving an input signal IN and a drain. Transistor 30 has a source connected to ground, a gate for receiving a complementary input signal INB, and a drain. Transistor 24 has a drain connected to the drain of transistor 28, a gate connected to the drain of transistor 30, and a source connected to a node for receiving an intermediate voltage VNM. This node may be referred to as VNM and may be considered a power supply terminal. Transistor 26 has a drain connected to the drain of transistor 30, a gate connected to the drain of transistor 28, and a source connected to VNM.

Transistor 32 has a source connected to the drain of transistor 17, a gate connected to VPM, and a drain. Transistor 34 has a source connected to the drain of transistor 18, a gate connected to VPM, and a drain. Transistor 36 has a source connected to the drain of transistor 28, a gate connected to VNM, and a drain connected to the drain of transistor 32. Transistor 38 has a source connected to the drain of transistor 30, a gate connected to VNM, and a drain connected to the drain of transistor 34.

Voltage VPM is preferably a positive voltage less than voltage Vhi with the difference between voltages VPM and Vhi less than a breakdown voltage of the transistors of latch 12. Similarly, voltage VNM is preferably a positive voltage less than a breakdown voltage of the transistors of latch 14.

Circuit 40 includes a P channel transistor 44, a P channel transistor 46, an N channel transistor 48, and an N channel transistor 50. Transistor 44 has a source coupled to a voltage supply Vtop, a gate coupled to the drain of transistor 18, and a drain. Transistor 46 has source coupled to the drain of transistor 44, a gate coupled to VPM, and a drain as an output of circuit OUT of circuit 40. Transistor 48 has a drain coupled to the drain of transistor 46, a gate coupled to VNM, and a source. Transistor 50 has a drain coupled to the source of transistor 48, a gate coupled to a control signal CTL, and a source coupled to a power supply terminal VBOT that may be connected to ground or some other voltage near ground. Circuit 40 functions to provide a signal that is analogous to an inverse of OUT1 with a slightly different high voltage Vtop than Vhi if OUT 1 is a logic low. Circuit 40 provides its output at Vbot if control signal CTL is a logic high and as a high impedance if OUT 1 is a logic high and control signal CTL is a logic low. This type of circuit has P channel control of the signal that has been level shifted.

Circuit 42 includes a P channel transistor 54, an N channel transistor 56, a P channel transistor 58, an channel transistor 60, a P channel transistor 62, and an N channel transistor 64. P channel transistor 54 has a source coupled to Vhi, a gate coupled to the drain of transistor 18, and a drain. Transistor 56 has a drain coupled to the drain of transistor 54, a source coupled to VPM, and a gate. Transistor 58 has a source coupled to Vhi, a gate coupled to the drain of transistor 17 shown as node A, and a drain coupled to the gate of transistor 56. Transistor 60 has a drain coupled to the drain of transistor 58, a gate coupled to the drains of transistors 54 and 56, and a source coupled to VPM. Transistors 54, 56, 58, and 60 form a level shifter that converts OUT1 it to a further level-shifted signal that allows including N channel control as shown with the inverter formed of transistors 62 and 64. This shows both N and P channel control.

In operation where level shifter 10 receives input signal IN at a logic high, which may also be called a logic 1, and input signal INB at a logic low, which may be called a logic 0, level shifter 10 provides an output OUT1 and an OUT2 at a logic high at the voltage at Vhi. This is achieved by the logic high of input IN causing transistor 28 to be conductive and transistor 30 to be non-conductive. Transistor 28 causes a logic low to be applied to the gate of transistor 26 causing transistor 26 to be conductive. Transistor 26 being conductive and transistor 30 being non-conductive causes voltage VNM to be present on the gate of transistor 24 causing transistor 24 to be non-conductive. Transistor 36 has voltage VNM on its gate and ground on its source so that its drain is pulled to ground which also causes the drain of transistor 32 to be at ground. In such a situation, transistors 36 and 28 provide a path to ground so that node A can have current drawn from it through transistor 32. Transistor 32, with its gate at voltage VPM, limits how far the voltage can drop on the drains of transistors 20 and 17 to one P channel threshold voltage above VPM. Further, with transistor 20 connected as a diode, node A is also limited to not dropping below an N channel threshold below VPM. While node A is dropping in voltage but with limits on how far, the gate of transistor 17 rises in voltage without any loading from transistor 22 because it is connected as a diode. Transistor 38, being non-conductive, prevents current flow from the drains of transistors 18 and 22. With the drains of transistors 17 and 20 in the range of VPM plus a P channel threshold or minus an N channel threshold and thus the gate of transistor 18 at that voltage, transistor 18 is conductive. With transistor 18 conductive and transistor 38 non-conductive, OUT1 is provided as Vhi. The drains of transistors 18 and 22 are output OUT1. With OUT1 at Vhi, transistor 22 is not conductive and the drains of transistors 17 and 20 are at a voltage range of VPM plus a P channel threshold or minus a threshold. In this condition of level shifter 10, OUT1 is at voltage Vhi, which may be used for programming or erasing NVM cells. Also in this condition, the maximum magnitude of the gate to source voltage or gate to drain voltage for P channel transistors 17 and 18, which is typically has the lowest breakdown voltage of a transistor, is voltage Vhi minus voltage VPM plus an N channel threshold voltage for latch 12. For the case of VPM being 5, Vhi being 10, and an N channel threshold voltage being 0.7, the maximum voltage seen by transistors 17 and 18 will be 5.7 volts. For latch 14, the largest magnitude of the gate to source/drain voltage is voltage VNM. Further, transistor 18 is the only transistor in the path from Vhi to output OUT1 of level shifter 10 so that there is no added resistance to OUT1. Further this remains true as voltage Vhi changes. Voltage VNM and voltage Vhi minus voltage VPM are kept low enough to ensure the gate to source/drain breakdown voltages of the transistors are not reached. If necessary, voltage VPM can change as voltage Vhi is varied to ensure that the difference does not exceed the gate to source/drain breakdown.

The diode connected transistors 20 and 22 are effective in keeping node A and OUT1 at a voltage that is not too low so as to cause an excessive voltage across either transistor 17 or 18 but also do not provide current flow when the voltage is intended to rise. In this case of node OUT1 switching to a logic low, it is desirable that the voltage on gate 17 rise to turn off transistor 17. With transistor 22 connected as a diode, transistor 22 does not draw current and therefore does not impede the desired rise in voltage on the gate of transistor 17. When the transition has been made so that node A is at a logic low and OUT1 is at a logic high, diode 20 prevents node A from drifting below VPM minus an N channel threshold voltage and transistor 32 prevents node A from drifting above VMP plus a P channel threshold. Thus transistor 20 is non-conductive unless node A drifts below VPM minus an N channel threshold. In this condition, OUT1 is logic high at Vhi and transistor 22 is non-conductive in this state.

Two other outputs in addition to OUT1 are shown in FIG. 1. An output OUT2 is provided at the drains of transistors 34 and 38 and provides either Vhi or VSS, which may be ground, as an output [Vhi:VSS]. Voltage Vhi is provided on OUT2 through transistors 18 and 34 with the input conditions of input IN at a logic high and complementary input INB at a logic low. An output OUT3 is provided at the drains of transistors 26 and 30 and provide a voltage of VNM through transistor 26. OUT3 then is either VNM or VSS, [VNM: VSS]. OUT1 is either Vhi or VPN plus a P channel threshold or minus an N channel threshold, [Vhi:VPN+Vtp/−Vtn]

For the case where input IN is a logic low and INB is a logic high, transistor 28 is non-conductive and transistor 30 is conductive. Transistor 24 becomes conductive causing transistor 26 to become non-conductive. This causes transistor 38 to be conductive and able to draw current from OUT1. On the other hand transistor 36 is prevented from drawing current from node A. As current is drawn from OUT1 through transistors 34, 38, and 30, OUT1 begins declining in voltage causing transistor 17 to begin being conductive. Transistor 20, being diode connected is non-conductive so that the drop in voltage is unimpeded by transistor 20. Transistor 17 becoming conductive causes transistor 18 to become less conductive due to the rise in voltage on node A unimpeded by current through transistor 20 because it is diode connected. This continues until transistor 17 is conductive and transistor 18 is non-conductive. As a result output OUT1 becomes a logic low at voltage VPM plus a P channel threshold voltage or minus an N channel transistor. Eventually transistor 22 may begin conducting in order to hold keep OUT1 from dropping below VPM minus an N channel threshold voltage. There is only transistor 22 between output OUT1 and voltage VPM. Outputs OUT2 and OUT3 are at ground. Output OUT3 has a benefit of only one transistor between it and ground.

At the time immediately prior to the transition of OUT1 to a logic low, OUT 1 is at Vhi so that transistor 17 is non-conductive. As current begins flowing through transistors 30, 38, and 34 to reduce the voltage of OUT1, transistor 22 is non-conductive so that it does not impede the reduction in voltage on the gate of transistor 17 which causes transistor 17 to become conductive and cause transistor 18 to become non-conductive. Thus, there is a high degree of margin in the manufacturing process for ensuring a reliable transition.

The use of OUT1 is shown in circuits 40 and 42 in which it is seen that the voltage range of OUT1 in its logic low condition is not a problem. Circuit 40 for example, is a prior art circuit for use with OUT1, and it functions well with the OUT1 of level shifter 10. Circuit 40 provides Vtop when its signal input, which is received by transistor 44, is a logic low. The output of circuit OUT1, anywhere in the range of VPM minus an N channel threshold or plus a P channel threshold is sufficiently low to ensure that transistor 44 is conductive with Vtop near Vhi. The expectation in this type of circuit is that VPM will be sufficiently below Vhi to provide adequate headroom, and Vtop will be less than or about equal to Vhi. Thus a variation of the logic low of OUT1 of about VPM volts plus or minus a threshold voltage where both N and P may be about 0.7 volt ensures that transistor 44 will be very conductive with OUT1 at a logic low.

Similarly for circuit 42, which is also a prior art circuit, transistors 54 and 58 can easily respond reliably to OUT1 and node A to provide the needed level-shifted signal that, as seen with the inverter of transistors 62 and 64, includes N channel control. Circuit 42 outputs Vhi or VPM, [Vhi:VPM].

Thus is shown a level-shifter with the ability to function as needed with a wide margin for process changes due to using diodes, which can be conveniently made using N channel transistors, to ensure that a transistor, that needs to switch states, is not impeded from doing so due to having its gate voltage held too long in the unswitched condition.

By now it should be appreciated that there has been provided a circuit incuding a level shifter, a first stage, a first current path and a second current path. The level shifter includes an input to receive a signal to be level shifted, a first power supply terminal and a second power supply terminal, and a first output node and a second output node. The first stage includes a third power supply terminal, a fourth power supply terminal, a first node, a second node, a first transistor the first transistor including a first current terminal coupled to the third power supply terminal, a second current terminal coupled to the first node, and control terminal connected to the second node, a second transistor, the second transistor including a first current terminal coupled to the third power supply terminal, a second current terminal coupled to the second node, and a control terminal connected to the first node, a first diode circuit located in a current path between the fourth power supply terminal and the first node with a first terminal of the first diode circuit coupled to the fourth power supply terminal and a second terminal of the first diode circuit coupled to the first node, and a second diode circuit located in a current path between the fourth power supply terminal and the second node with a first terminal of the second diode circuit coupled to the fourth power supply terminal and a second terminal of the second diode circuit coupled to the second node. The first current path is from the first output node of the level shifter to the first node and includes a third transistor and a fourth transistor coupled in series, wherein the third transistor includes a control terminal coupled to the second power supply terminal and the fourth transistor includes a control terminal coupled to the fourth power supply terminal. The second current path is from the second output node of the level shifter to the second node and includes a fifth transistor and a sixth transistor coupled in series, wherein the fifth transistor includes a control terminal coupled to the second power supply terminal and the sixth transistor includes a control terminal coupled to the fourth power supply terminal. The circuit may have a further characterization by which the second node provides a level shifted signal of a signal received at the input during operation and the first terminal of the second diode circuit is characterized as an anode and the second terminal of the second diode circuit is characterized as a cathode. The circuit may have a further characterization by which the first diode circuit is implemented with a first diode configured transistor and the second diode circuit is implemented with a second diode configured transistor. The circuit may have a further characterization by which the first terminal of the first diode circuit is characterized as an anode and the second terminal of the first diode circuit is characterized as a cathode and. The circuit may have a further characterization by which the first diode configured transistor is characterized as an NFET transistor and the second diode configured transistor is characterized an NFET transistor. The circuit may have a further characterization by which the level shifter includes a second input to receive a complementary signal to a signal received at the input, wherein a signal provided at the first node is a level shifted signal of a signal received at the second input during operation. The circuit may have a further characterization by which the first and second transistors are each characterized as a PFET transistor. The circuit may have a further characterization by which the level shifter includes a seventh transistor, an eighth transistor, a ninth transistor, and a tenth transistor, the level shifter includes a seventh transistor, an eighth transistor, a ninth transistor, and a tenth transistor, the seventh transistor includes first current terminal coupled to the first power supply terminal, a second current terminal coupled to the first output node, and a control terminal coupled to the input, the eighth transistor includes first current terminal coupled to the first power supply terminal, a second current terminal coupled to the second output node, and a control terminal coupled to a second input to receive a signal complementary of the signal received by the input, the ninth transistor includes a first current terminal coupled to the second power supply terminal, a second current terminal coupled to the first output node, and a control terminal coupled to the second output node, and the tenth transistor includes a first current terminal coupled to the second power supply terminal, a second current terminal coupled to the second output node, and a control terminal coupled to the first output node. The circuit may have a further characterization by which the third and fifth transistors are each characterized as NFET transistors and the fourth and sixth transistors are each characterized as PFET transistors. The circuit may have a further characterization by which a voltage range of each of the first node and the second node is between a voltage of the third power supply terminal and a second voltage, where the second voltage is within a threshold voltage of a voltage of the fourth power supply terminal. The circuit may have a further characterization by which a voltage range of the first output node and the second output node is between a voltage of the first power supply terminal and a voltage of the second power supply terminal. The circuit may have a further characterization by which the second node is coupled to a control terminal of a PFET of a multiplexer circuit. The circuit may have a further characterization by which a second level shifter including an input coupled to the second node, the second level shifter including an output. The circuit may have a further characterization by which the output of the second level shifter is coupled to a control terminal of an NFET transistor of an inverter. The circuit may have a further characterization by which a voltage range of the second node is between a voltage of the third power supply terminal and a second voltage where the second voltage is within a threshold voltage of a voltage of the fourth power supply terminal and a voltage range of the output of the second level shifter is between the voltage of the third power supply and the voltage of the fourth power supply terminal. The circuit may have a further characterization by which the first node is coupled to a second input of the second level shifter. The circuit may have a further characterization by which the second power supply terminal and the fourth power supply terminal are coupled together to supply the same voltage. The circuit may have a further characterization by which the second power supply terminal and the fourth power supply terminal are configured to provide different voltages.

Also disclosed is a level shifting circuit that includes a first transistor including a first current terminal connected to a first power supply terminal, a second current terminal connected to a first node, and a control terminal configured to receive a first input signal. The level shifting circuit further includes a second transistor including a first current terminal connected to the first power supply terminal, a second current terminal connected to a second node, and a control terminal configured to receive a second input signal that is complementary to the first input signal. The level shifting circuit further includes a third transistor including a first current terminal connected to the first node, a second current terminal connected to a second power supply terminal and a control terminal connected to the second node. The level shifting circuit further includes a fourth transistor including a first current terminal connected to the second node, a second current terminal connected to the second power supply terminal and a control terminal connected to the first node. The level shifting circuit further includes a fifth transistor including a first current terminal connected to the first node, a second current terminal, and a control terminal connected to the second power supply terminal. The level shifting circuit further includes a sixth transistor including a first current terminal connected to the second node, a second current terminal, and a control terminal connected to the second power supply terminal. The level shifting circuit further includes a seventh transistor including a first current terminal connected to the second current terminal of the fifth transistor, a second current terminal connected to a third node, and a control terminal connected to a third power supply terminal. The level shifting circuit further includes an eighth transistor including a first current terminal connected to the second current terminal of the sixth transistor, a second current terminal connected to a fourth node, and a control terminal connected to the third power supply terminal. The level shifting circuit further includes a ninth transistor including a first current terminal connected to a fourth power supply terminal, a second current terminal connected to the third node, and a control terminal connected to the fourth node. The level shifting circuit further includes a tenth transistor including a first current terminal connected to the fourth power supply terminal, a second current terminal connected to the fourth node, and a control terminal connected to the third node. The level shifting circuit further includes an eleventh transistor including a first current terminal connected to the third node, a second current terminal connected to the third power supply terminal, and a control terminal connected to the third power supply terminal. The level shifting circuit further includes a twelfth transistor including a first current terminal connected to the fourth node, a second current terminal connected to the third power supply terminal, and a control terminal connected to the third power supply terminal.

Disclosed also is a level shifting circuit that includes a first input node to receive a first input signal. The level shifting circuit further includes a second input node to receive a second input signal, the second input signal is complementary to the first input signal. The level shifting circuit further includes a first output node, a signal provided at the first output node is a level shifted signal of the second input signal received at the second input node. The level shifting circuit further includes a second output node, a signal provided at the second output node is a level shifted signal of the first input signal received at the first input node, wherein a voltage range of the first input signal and the second input signal is between a first voltage and a second voltage, wherein the first voltage is greater than the second voltage. The level shifting circuit further includes a first diode circuit located in a current path between the first output node and a first power supply terminal. The level shifting circuit further includes a second diode circuit located in a current path between the second output node and the first power supply terminal, wherein the first power supply terminal is configured to provide a voltage that is greater than the second voltage.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, different voltages for the Vhi, WPM, and WNM may be used. Also it may be effective to use a PN junction as a diode. Also power supply voltages of supplied at power supply terminals VPM and VNM may be different voltages or may be the same. If they are the same they be merged as one power supply terminal. Accordingly, the specification and FIGURES are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a level shifter including an input to receive a signal to be level shifted, the level shifter including a first power supply terminal and a second power supply terminal, the level shifter including a first output node and a second output node;
   a first stage comprising:
   a third power supply terminal;
   a fourth power supply terminal;
   a first node;
   a second node;
   a first transistor the first transistor including a first current terminal coupled to the third power supply terminal, a second current terminal coupled to the first node, and control terminal connected to the second node;
   a second transistor, the second transistor including a first current terminal coupled to the third power supply terminal, a second current terminal coupled to the second node, and a control terminal connected to the first node;

a first diode circuit located in a current path between the fourth power supply terminal and the first node with a first terminal of the first diode circuit coupled to the fourth power supply terminal and a second terminal of the first diode circuit coupled to the first node; and a second diode circuit located in a current path between the fourth power supply terminal and the second node with a first terminal of the second diode circuit coupled to the fourth power supply terminal and a second terminal of the second diode circuit coupled to the second node;

a first current path from the first output node of the level shifter to the first node, the first current path including a third transistor and a fourth transistor coupled in series, wherein the third transistor includes a control terminal coupled to the second power supply terminal and the fourth transistor includes a control terminal coupled to the fourth power supply terminal; and a second current path from the second output node of the level shifter to the second node, the second current path including a fifth transistor and a sixth transistor coupled in series, wherein the fifth transistor includes a control terminal coupled to the second power supply terminal and the sixth transistor includes a control terminal coupled to the fourth power supply terminal.

2. The circuit of claim 1 wherein the second node provides a level shifted signal of a signal received at the input during operation.

3. The circuit of claim 1 wherein:
the first terminal of the first diode circuit is characterized as an anode and the second terminal of the first diode circuit is characterized as a cathode; and
the first terminal of the second diode circuit is characterized as an anode and the second terminal of the second diode circuit is characterized as a cathode.

4. The circuit of claim 1 wherein the first diode circuit is implemented with a first diode configured transistor and the second diode circuit is implemented with a second diode configured transistor.

5. The circuit of claim 4 wherein the first diode configured transistor is characterized as an NFET transistor and the second diode configured transistor is characterized an NFET transistor.

6. The circuit of claim 1 wherein the level shifter includes a second input to receive a complementary signal to a signal received at the input, wherein a signal provided at the first node is a level shifted signal of a signal received at the second input during operation.

7. The circuit of claim 1 wherein the first and second transistors are each characterized as a PFET transistor.

8. The circuit of claim 1 wherein:
the level shifter includes a seventh transistor, an eighth transistor, a ninth transistor, and a tenth transistor,
the seventh transistor includes first current terminal coupled to the first power supply terminal, a second current terminal coupled to the first output node, and a control terminal coupled to the input;
the eighth transistor includes first current terminal coupled to the first power supply terminal, a second current terminal coupled to the second output node, and a control terminal coupled to a second input to receive a signal complementary of the signal received by the input;
the ninth transistor includes a first current terminal coupled to the second power supply terminal, a second current terminal coupled to the first output node, and a control terminal coupled to the second output node; and the tenth transistor includes a first current terminal coupled to the second power supply terminal, a second current terminal coupled to the second output node, and a control terminal coupled to the first output node.

9. The circuit of claim 1 wherein the third and fifth transistors are each characterized as NFET transistors and the fourth and sixth transistors are each characterized as PFET transistors.

10. The circuit of claim 1 wherein a voltage range of each of the first node and the second node is between a voltage of the third power supply terminal and a second voltage, where the second voltage is within a threshold voltage of a voltage of the fourth power supply terminal.

11. The circuit of claim 1 wherein a voltage range of the first output node and the second output node is between a voltage of the first power supply terminal and a voltage of the second power supply terminal.

12. The circuit of claim 1 wherein the second node is coupled to a control terminal of a PFET of a multiplexer circuit.

13. The circuit of claim 1 further comprising:
a second level shifter including an input coupled to the second node, the second level shifter including an output.

14. The circuit of claim 13 wherein the output of the second level shifter is coupled to a control terminal of an NFET transistor of an inverter.

15. The circuit of claim 13 wherein:
a voltage range of the second node is between a voltage of the third power supply terminal and a second voltage where the second voltage is within a threshold voltage of a voltage of the fourth power supply terminal; and
a voltage range of the output of the second level shifter is between the voltage of the third power supply and the voltage of the fourth power supply terminal.

16. The circuit of claim 13 wherein the first node is coupled to a second input of the second level shifter.

17. The circuit of claim 1 wherein the second power supply terminal and the fourth power supply terminal are coupled together to supply the same voltage.

18. The circuit of claim 1 wherein the second power supply terminal and the fourth power supply terminal are configured to provide different voltages.

19. A level shifting circuit comprising:
a first transistor including a first current terminal connected to a first power supply terminal, a second current terminal connected to a first node, and a control terminal configured to receive a first input signal;
a second transistor including a first current terminal connected to the first power supply terminal, a second current terminal connected to a second node, and a control terminal configured to receive a second input signal that is complementary to the first input signal;
a third transistor including a first current terminal connected to the first node, a second current terminal connected to a second power supply terminal and a control terminal connected to the second node;
a fourth transistor including a first current terminal connected to the second node, a second current terminal connected to the second power supply terminal and a control terminal connected to the first node;
a fifth transistor including a first current terminal connected to the first node, a second current terminal, and a control terminal connected to the second power supply terminal;

a sixth transistor including a first current terminal connected to the second node, a second current terminal, and a control terminal connected to the second power supply terminal;

a seventh transistor including a first current terminal connected to the second current terminal of the fifth transistor, a second current terminal connected to a third node, and a control terminal connected to a third power supply terminal;

an eighth transistor including a first current terminal connected to the second current terminal of the sixth transistor, a second current terminal connected to a fourth node, and a control terminal connected to the third power supply terminal;

a ninth transistor including a first current terminal connected to a fourth power supply terminal, a second current terminal connected to the third node, and a control terminal connected to the fourth node;

a tenth transistor including a first current terminal connected to the fourth power supply terminal, a second current terminal connected to the fourth node, and a control terminal connected to the third node;

an eleventh transistor including a first current terminal connected to the third node, a second current terminal connected to the third power supply terminal, and a control terminal connected to the third power supply terminal; and a twelfth transistor including a first current terminal connected to the fourth node, a second current terminal connected to the third power supply terminal, and a control terminal connected to the third power supply terminal.

* * * * *